(12) United States Patent
Gupta et al.

(10) Patent No.: US 11,588,489 B1
(45) Date of Patent: Feb. 21, 2023

(54) OBTAINING LOCK IN A PHASE-LOCKED LOOP (PLL) UPON BEING OUT OF PHASE-LOCK

(71) Applicant: Shaoxing Yuanfang Semiconductor Co., Ltd., Shaoxin (CN)

(72) Inventors: Rakesh Kumar Gupta, Bangalore (IN); Nitesh Naidu, Bangalore (IN); Raja Prabhu J, Bangalore (IN); Srinath Sridharan, Bangalore (IN); Ankit Seedher, Bangalore (IN); Shivam Agrawal, Bangalore (IN)

(73) Assignee: Shaoxing Yuanfang Semiconductor Co., Ltd., Zhejiang (CN)

( * ) Notice: Subject to any disclaimer, the term of this patent is extended or adjusted under 35 U.S.C. 154(b) by 0 days.

(21) Appl. No.: 17/662,660

(22) Filed: May 10, 2022

(30) Foreign Application Priority Data

Oct. 6, 2021 (IN) .............................. 202141045501

(51) Int. Cl.
*H03L 7/091* (2006.01)
*H03L 7/081* (2006.01)
*H03L 7/099* (2006.01)

(52) U.S. Cl.
CPC ............ *H03L 7/091* (2013.01); *H03L 7/0814* (2013.01); *H03L 7/0992* (2013.01)

(58) Field of Classification Search
CPC ...... H03L 7/091; H03L 7/0814; H03L 7/0992
See application file for complete search history.

(56) References Cited

U.S. PATENT DOCUMENTS

| | | |
|---|---|---|
| 5,207,491 A | 5/1993 | Rottinghaus |
| 5,638,410 A | 6/1997 | Kuddes |
| 5,648,964 A | 7/1997 | Inagaki et al. |
| 5,740,211 A | 4/1998 | Bedrosian |
| 6,144,674 A | 11/2000 | Peres et al. |
| 6,362,670 B1 | 3/2002 | Beaulieu |
| 6,366,146 B2 | 4/2002 | Fredriksson |

(Continued)

FOREIGN PATENT DOCUMENTS

| | | |
|---|---|---|
| EP | 0315489 | 5/1989 |
| JP | 2000278126 A | 10/2000 |
| WO | WO2017189160 A1 | 9/2016 |

OTHER PUBLICATIONS

Si5345/44/42 Rev D Data Sheet, http://www.mouser.com/ds/2/368/Si5345-44-42-D-DataSheet-968622.pdf, downloaded circa Sep. 12, 2017, 61 pages.

(Continued)

*Primary Examiner* — Adam D Houston
(74) *Attorney, Agent, or Firm* — Iphorizons PLLC; Narendra Reddy Thappeta

(57) ABSTRACT

A phase-locked loop (PLL) provided according to an aspect of the present disclosure includes a phase detector, a low-pass filter, an oscillator, an output block and a phase locking block. The oscillator generates an intermediate clock and the output block generates each of successive cycles of a feedback clock on counting a pre-determined number of cycles of the intermediate clock. The phase locking block, upon detecting the PLL being out of phase-lock, controls the operation of the output block to obtain phase-lock in the PLL within two cycles of the input clock from the time of detection of the PLL being out of phase-lock.

20 Claims, 9 Drawing Sheets

(56) References Cited

U.S. PATENT DOCUMENTS

| | | | |
|---|---|---|---|
| 6,380,776 B1* | 4/2002 | Yocom | H03L 7/0993 327/155 |
| 6,570,454 B2 | 5/2003 | Skierszkan | |
| 6,664,827 B2 | 12/2003 | O'Leary et al. | |
| 6,741,109 B1 | 5/2004 | Huang et al. | |
| 6,806,751 B2 | 10/2004 | Helfinstine | |
| 7,126,432 B2 | 10/2006 | Roubadia et al. | |
| 7,369,002 B2 | 5/2008 | Spijker et al. | |
| 7,405,628 B2 | 7/2008 | Hulfachor et al. | |
| 7,719,368 B1 | 5/2010 | Smith et al. | |
| 7,893,736 B2 | 2/2011 | Palmer et al. | |
| 7,965,115 B2 | 6/2011 | Jin | |
| 8,509,370 B2 | 8/2013 | Bhagavatheeswaran et al. | |
| 9,007,105 B2 | 4/2015 | Jenkins | |
| 9,362,924 B1 | 6/2016 | Xu et al. | |
| 9,602,113 B2 | 3/2017 | Galton et al. | |
| 9,628,094 B2 | 4/2017 | Lotly et al. | |
| 10,158,364 B1 | 12/2018 | Tsai et al. | |
| 10,404,445 B1* | 9/2019 | Zhang | H03L 7/0807 |
| 10,514,720 B1 | 12/2019 | J et al. | |
| 10,644,869 B2 | 5/2020 | Tsai et al. | |
| 10,826,507 B1* | 11/2020 | Gong | H03L 7/183 |
| 11,211,936 B1* | 12/2021 | Tsai | H03L 7/0814 |
| 11,218,153 B1* | 1/2022 | Moehlmann | H03L 7/0992 |
| 2003/0133522 A1 | 7/2003 | Staszewski et al. | |
| 2004/0232995 A1* | 11/2004 | Thomsen | H03L 7/0992 331/2 |
| 2004/0232997 A1* | 11/2004 | Hein | H03L 1/022 331/16 |
| 2006/0119437 A1* | 6/2006 | Thomsen | H03L 7/197 331/10 |
| 2007/0120585 A1* | 5/2007 | Kishibe | H03L 7/089 327/156 |
| 2007/0254600 A1 | 11/2007 | Ishii | |
| 2007/0285177 A1 | 12/2007 | Werker | |
| 2008/0002801 A1 | 1/2008 | Droege et al. | |
| 2019/0199361 A1* | 6/2019 | Sudalaiyandi | H03K 5/131 |
| 2019/0384351 A1* | 12/2019 | J | H03L 7/093 |
| 2020/0076439 A1* | 3/2020 | Weeks | H03L 7/0805 |
| 2020/0162081 A1* | 5/2020 | Jayakumar | H03L 7/093 |
| 2020/0313945 A1* | 10/2020 | Mukherjee | H04L 27/2271 |
| 2020/0403620 A1* | 12/2020 | Wang | H03L 7/20 |

OTHER PUBLICATIONS

82P33731 Datasheet, https://www.idt.com/document/dst/82p33731-datasheet, downloaded circa Sep. 13, 2017, 65 pages.

AD9547 Data Sheet, Dual/Quad Input Network Clock Generator/Synchronizer, http://www.analog.com/media/en/technical-documentation/data-sheets/AD9547.pdf, downloaded circa Sep. 19, 2017, 61 pages.

Snaa208 Using the LMK0480x/LMK04906 for Hitless Switching and Holdover, http://www.ti.com/lit/an/snaa208/snaa208.pdf, date Jul. 12, 2013, 13 pages.

CS8525 LC/P Line Card Protection Switch for SONET/SDH Systems, http://www.semtech.com/images/datasheet/acs8525.pdf, downloaded circa Sep. 8, 2017, 65 pages.

Slobodan Milijevic, The basics of synchronized Ethernet, Data Transmission, date Apr. 21, 2009, 04 pages.

D.C. Wei, et al., A monolithic low-bandwidth jitter-cleaning PLL with hitless switching for SONET/SDH clock generation, 2006 IEEE International Solid State Circuits Conference—Digest of Technical Papers, Date of Conference: Feb. 6-9, 2006, 2 pages.

MAX 10 Clocking and PLL User Guide, https://www.intel.com/content/dam/www/programmable/us/en/pdfs/literature/hb/max-10/archives/ug-m10-clkpll-15.1.pdf, Nov. 2, 2015, 72 Pages.

Sheng Ye, et al., A Multiple-Crystal Interface PLL with VCO Realignment to Reduce Phase Noise, 2002 IEEE International Solid-State Circuits Conference. Digest of Technical Papers, Date of Conference: Feb. 7-7, 2002, 03 Pages, IEEE, San Francisco, CA, USA.

Liang Wang, et al., A Novel Phase-Locked Loop Based on Frequency Detector and Initial Phase Angle Detector, IEEE Transactions on Power Electronics (vol. 28, Issue: 10, Oct. 2013), Date of Publication: Dec. 28, 2012, 11 Pages, IEEE.

Dramatically Improve Your Lock Time with VCO Instant Calibration, https://www.ti.com/lit/an/snaa342/snaa342.pdf?ts=1637913867099&ref_url=https%253A%252F%252Fwww.google.com%252F, Sep. 2020, 12 Pages.

Streamline RF Synthesizer VCO Calibration and OptimizePLL Lock Time, https://www.ti.com/lit/an/snaa336a/snaa336a.pdf?ts=1637914131915&ref_url=https%253A%252F%252Fwww.google.com%252F, Jan. 2020, 18 pages.

Hae-Soo Jeon, et al., Fast Frequency Acquisition All-Digital PLL Using PVT Calibration, 2008 IEEE International Symposium on Circuits and Systems (ISCAS), Date of Conference: May 18-21, 2008, pp. 2625-2628, IEEE, Seattle, WA, USA.

* cited by examiner

OBTAINING LOCK IN A PHASE-LOCKED LOOP (PLL) UPON BEING OUT OF PHASE-LOCK

PRIORITY CLAIM

The instant patent application is related to and claims priority from the co-pending India provisional patent application entitled, "Fast Lock in a Phase-Locked Loop", Serial No.: 202141045501, Filed: 6 Oct. 2021, which is incorporated in its entirety herewith to the extent not inconsistent with the description herein.

BACKGROUND

Technical Field

Embodiments of the present disclosure relate generally to phase-locked loops (PLLs), and more specifically to obtaining lock in a PLL upon being out of phase-lock.

Related Art

Phase-locked loops (PLLs) are frequently used to generate clock signal(s). A PLL receives an input clock and generates an output clock (the clock signal) usually at a frequency that is a desired multiple of the frequency of the input clock but which can also be at the same frequency as the input clock. A PLL may be referred to as a Zero-Delay-Buffer (ZDB) when output clock frequency equals the input clock frequency.

A PLL is said to be in lock when the output clock is both frequency and phase aligned with the input clock. A phase detector is normally employed in combination with other components to check whether such a lock is indeed present during the normal operation of a PLL and corrective action is thereafter undertaken for the desired lock.

There are often situations when a PLL goes out of lock, in terms of frequency and/or phase. When the PLL is out of lock in terms of the phase (but not frequency), the PLL is said to be out of phase-lock. Aspects of the present disclosure are directed to obtaining phase-lock upon a PLL being out of phase-lock.

BRIEF DESCRIPTION OF THE VIEWS OF DRAWINGS

Example embodiments of the present disclosure will be described with reference to the accompanying drawings briefly described below.

In the drawings, like reference numbers generally indicate identical, functionally similar, and/or structurally similar elements. The drawing in which an element first appears is indicated by the leftmost digit(s) in the corresponding reference number.

DETAILED DESCRIPTION

1. Overview

A phase-locked loop (PLL) provided according to an aspect of the present disclosure includes a phase detector, a low-pass filter, an oscillator, an output block and a phase locking block. The oscillator generates an intermediate clock and the output block generates each of successive cycles of a feedback clock on counting a pre-determined number of cycles of the intermediate clock. The phase locking block, upon detecting the PLL being out of phase-lock, controls the operation of the output block to obtain phase-lock in the PLL within two cycles of the input clock from the time of detection of the PLL being out of phase-lock.

According to another aspect of the present disclosure, the phase locking block obtains phase-lock in the PLL while also preventing glitches in the feedback clock during the locking operation by employing gating logic. In one embodiment, the feedback clock is an output clock of the PLL.

According to yet another aspect of the present disclosure, the phase locking block locks the phase of PLL by resetting a divider in the output block and then restarting the divider synchronously with respect to the input clock. In an embodiment, the phase locking block holds the divider in reset for one period of the input clock prior to the restart.

Several aspects of the present disclosure are described below with reference to examples for illustration. However, one skilled in the relevant art will recognize that the disclosure can be practiced without one or more of the specific details or with other methods, components, materials and so forth. In other instances, well known structures, materials, or operations are not shown in detail to avoid obscuring the features of the disclosure. Furthermore, the features/aspects described can be practiced in various combinations, though only some of the combinations are described herein for conciseness.

2. Example Device

Figure 1:
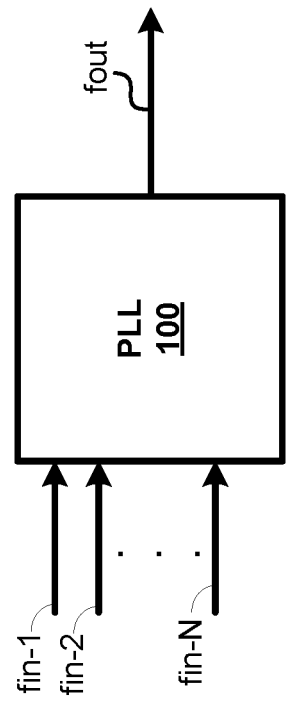
FIG. 1 is a block diagram of an example device in which several aspects of the present disclosure can be implemented.

FIG. 1 is a diagram illustrating the details of an example component in which several aspects of the present disclosure can be implemented. FIG. 1 shows phase-locked loop (PLL) 100 connected to receive input clocks fin-1, fin-2 through fin-N(N representing any natural number). PLL 100 selectively (e.g., under user control) receives one of the input clocks, and generates an output clock fout that is based on (or derived from) the selected input clock. Typically, the input clocks and fout have square-wave waveforms, and the frequency of fout is a desired multiple of the frequency of the currently selected input clock. The multiple can be any integer or fraction, and is typically equal to or greater than one.

The basic blocks of the PLL typically include a phase detector, a loop filter, a controlled oscillator, and a frequency divider. Negative feedback forces the error signal, generated by the phase error detector to approach zero at steady-state, at which point the frequency divider's output (also a clock) and the input frequency are in phase-lock and frequency-lock. The PLL is said to be in frequency as well as phase-lock in such a steady-state. Depending on the specific implementation of PLL 100, the frequency divider's output can be the output clock of the PLL with the frequency divider being in the forward path (and termed an output divider) as in a zero-delay buffer (ZDB) implementation, or the output of the controlled oscillator can be the output clock of the PLL with the frequency divider being in the feedback path when the frequency of the output clock is desired to be greater than that of the input clock.

PLL 100 can go out of phase-lock (after having achieved steady-state) if the input clock, say fin-1, changes its phase substantially. Such a change may occur, for example, when fin-1 is received from a network, and failures in the network (such as drop in data) lead to corresponding changes in phase of fin-1. Alternatively, PLL 100 can be out of phase-lock during an acquisition phase of the PLL, when only frequency-lock has been achieved. Also, PLL 100 can be out of phase-lock after selection of another (new) input clock with same/different frequency but a different phase (compared to fin-1).

In general, when such changes occur, the input clock and the feedback clock provided as inputs to the phase detector of PLL 100 are no longer locked in phase (but may be locked in frequency). When the difference in the phases of the input clock and the feedback clock is greater than a pre-determined out-of-lock threshold, the PLL is deemed to go out of phase-lock. As used herein, the term phase-lock means that phase error between the phases of input clock and feedback clock is either zero or ideally not more than a "steady-state threshold". The steady-state threshold generally depends on the jitter of the input clock. For example, for an input clock having a frequency of 1 Hertz (Hz), the steady-state threshold may be around 4-5 nano-seconds (ns) based on the nominal jitter of the input clock, and the out-of-lock threshold (noted above) may have a range between 3 to 5 times the steady-state threshold. Thus, in the example mentioned above, an out of phase-lock condition may be deemed to have occurred when the phase error exceeds about 20-30 ns. In general, the steady-state threshold and the out-of-lock threshold may vary based on the application of PLL.

Figure 2:
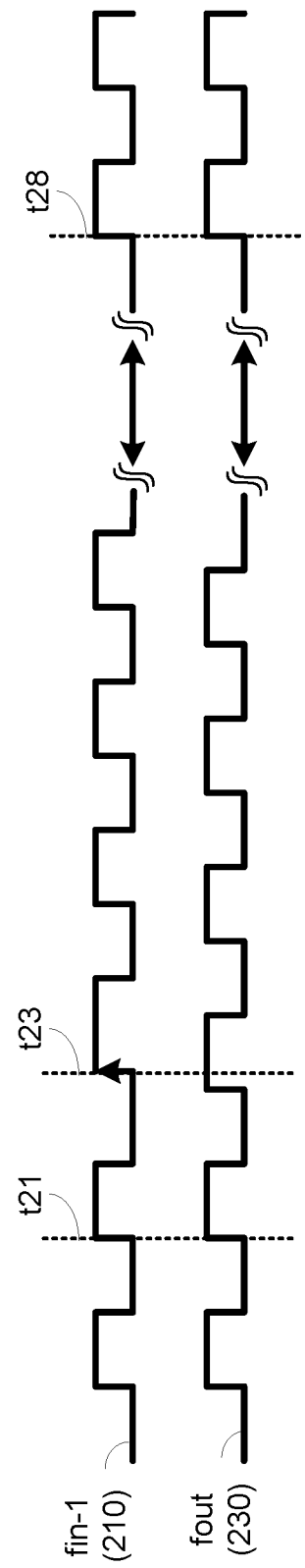
FIG. 2 is a timing diagram illustrating duration of locking phase in a prior technique.

As a result, in a prior implementation of PLL 100, the output clock of PLL 100 displays a behavior illustrated in FIG. 2. FIG. 2 is an example diagram depicting locking after a change in the phase of the input clock. In FIG. 2, the waveform depicting the locking is not to scale, and is provided merely to illustrate locking. In FIG. 2, waveform 210 represents the input clock (assumed to be fin-1) and waveform 230 depicts the output clock (fout). Until t21, PLL 100 is in a steady-state (frequency-lock and phase-lock). Accordingly, the rising edges of fin-1 and fout are aligned. At t23, the phase of fin-1 is shown to have changed abruptly. As a consequence, the prior PLL loses phase-lock (the rising edges of fout is no longer aligned with the rising edge of fin-1 starting at t23), and achieving phase-lock again at t28.

Several factors may affect the speed with which the relocking of phase may be achieved. One of the factors is the closed loop bandwidth (BW) of the PLL. The loop BW of a PLL is generally small (smaller than input frequency by around 100 times) in order to keep phase jitter of the output clock fout to a minimum. However, the low loop BW results in a longer locking duration (~several minutes for a 1 mHz bandwidth of PLL, for example). Such a long duration to obtain phase-lock may be undesirable/unacceptable at least in some environments.

A PLL implemented according to several aspects of the present disclosure minimizes the time taken to achieve or regain phase-lock, as described in detail below with respect to example embodiments.

3. Phase-Locked Loop

Figure 3:
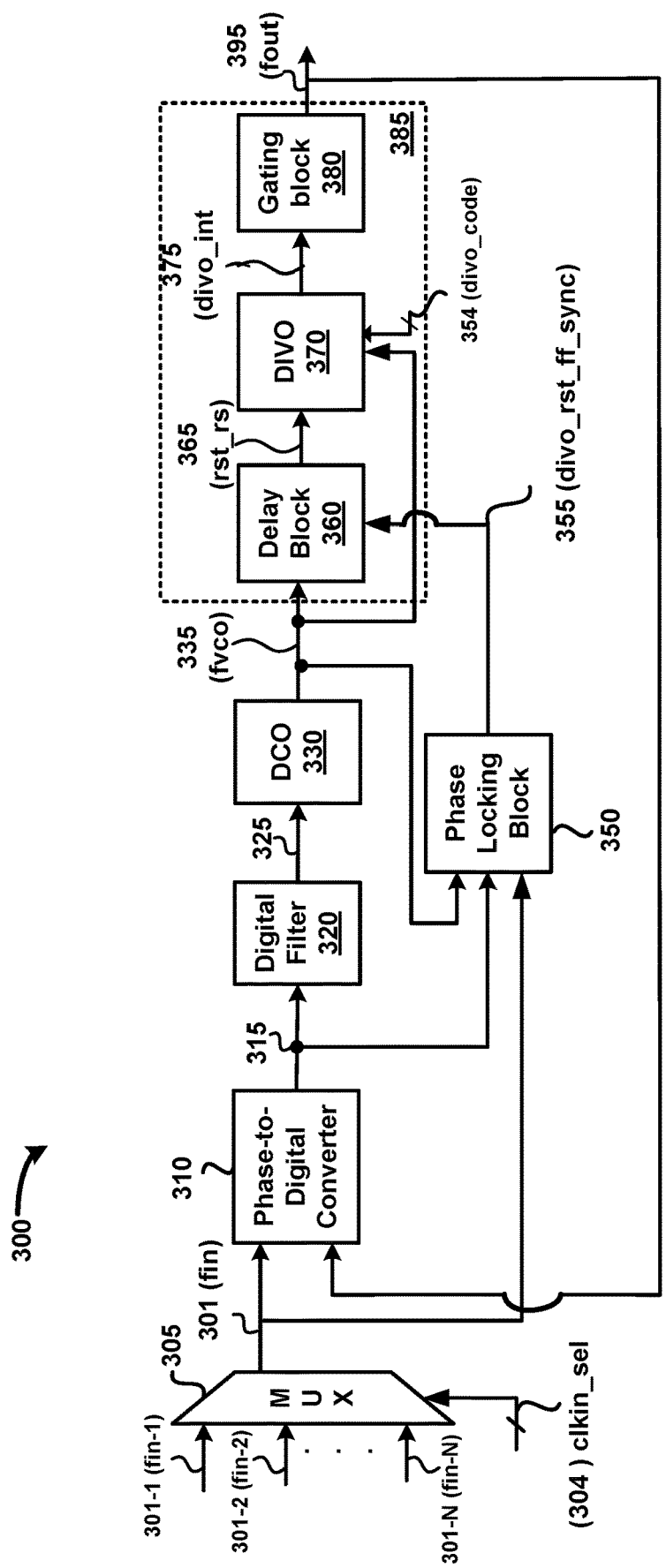
FIG. 3 is a block diagram of a PLL implemented in an embodiment of the present disclosure.

FIG. 3 is a block diagram of a PLL implemented according to several aspects of the present disclosure, in an embodiment. PLL 300, which may be implemented in place of PLL 100 of FIG. 1, is shown containing multiplexer (MUX) 305, phase-to-digital converter 310, digital filter 320, digitally controlled oscillator (DCO) 330, phase locking block 350 and output block 385. Output block 385 in turn is shown containing delay block 360, divider (DIVO) 370 and gating block 380. The specific blocks/components of PLL 300 of FIG. 3 are shown merely by way of illustration. Other embodiments of PLL 300 can be implemented with other blocks/components (analog, digital and/or a combination of analog and digital), as would be apparent to one skilled in the relevant arts by reading the disclosure herein. For example, phase-to-digital converter 310 can be replaced by a time-to-digital converter (TDC), with corresponding changes in PLL 300. Further, while blocks 320, 330, 350, 360, 370 and 380 are described as being implemented as digital blocks (block 310 may contain a mix of digital and analog sub-blocks), in another embodiment these blocks are implemented as traditional analog blocks, such as for example, analog phase detector plus charge pump, analog loop filter and voltage controlled oscillator (VCO).

Some or all components/blocks of PLL 300 can be implemented in integrated circuit form or discrete form or a combination of integrated and discrete form. In the embodiment of FIG. 3, PLL 300 is shown implemented as a zero-delay buffer (ZDB). In such an implementation, the feedback clock (provided as an input to phase to digital converter 310) is the output clock itself, as shown in FIG. 3. Accordingly, both the phase and frequency of fout equal those of the input clock when PLL 300 is in steady-state. In alternative implementations of PLL 300 as ZDB, multiple output clocks may be provided, with one output clock (ZDB output) having zero phase difference with respect to the input clock, and the other output clock(s) having a respective pre-determined phase relationship (e.g., +π/2, −π/4, etc.) with respect to the input clock. In such implementations, the feedback clock is the ZDB output clock; and the PLL is deemed to be in phase-lock when the respective pre-determined relationship is obtained with each output clock.

Although the description provided herein is with respect to PLL implemented as a ZDB, aspects of the present disclosure may be implemented with oscillator output fvco being provided as the output clock, with all or some of components of block 385 being in the feedback path. In an example implementation, delay block 360 and divider DIVO 370 may be in the feedback path and gating block 380 may be coupled to oscillator DCO 330 in the output path. In the context of a ZDB implementation, oscillator output will be referred to as an intermediate clock herein.

MUX 305 receives clocks fin-1 (301-1) to fin-N (301-N) (N representing any integer), and forwards one of fin-1 to fin-N on path 301 as an output (MUX output/selected clock, fin) based on the logic value of select signal 304 (clkin_sel). Select signal 304 may be set by a user (via corresponding means not shown) to indicate one of fin-1 to fin-N to be used as input clock. In some alternative embodiments, MUX 305 may not be implemented as part of PLL 300, and may instead be external to it.

Phase-to-digital converter 310 receives MUX output 301 (fin) and feedback clock 395 (fout), generates an error signal on path 315 whose value is proportional to the (present) phase difference between signals 301 and 395, and provides the error signal in digital form on path 315. Path 315 may represent one or multiple digital paths, each path for a corresponding bit of the digitized error signal.

In alternative embodiments, component/block 310 can be implemented as a time-to-digital converter (TDC) in a known way, with corresponding modifications to the implementation of other blocks of PLL 300 as would be apparent to one skilled in the relevant arts. In general, component 310 operates as a phase detector, receives signals 301 and 395 and generates an error signal on path 315, the error signal representing the phase error between the signals 301 and 395.

Under steady-state conditions of PLL 300, feedback clock 395 (fout) is in phase-lock and frequency-lock with respect to input clock 301 (fin). In other words, the frequency of feedback clock is same or substantially equal to the frequency of the input clock (frequency-lock). Also, the phase error between the signals 301 and 395 is either zero or is less than one cycle, and ideally not more than a few degrees (and far lesser than 360 degrees) (phase-lock).

Additionally, after power-ON or after reset of PLL 300, frequency-lock may be achieved first prior to achieving phase-lock. Further yet, when input clock is switched from one value to another, frequency-lock may be achieved first prior to achieving phase-lock. In such scenarios, PLL 300 can be in frequency-lock but out of phase-lock.

Several aspects of the present disclosure are directed to obtaining phase-lock in a very short time (which is not more than two cycles of the input clock in an embodiment).

Referring back to FIG. 3, digital filter 320 employs one or more digital low-pass filters. The digital low-pass filter(s) receive the digital values on path 315, and apply low-pass filtering to the stream of digital values. The filtered error signal (325) is provided as an input to DCO 330, and the magnitude of signal 325 determines the frequency of the clock waveform provided as an intermediate clock on path 335 (fvco). In an embodiment, DCO 330 is implemented as a digitally controlled crystal oscillator.

Delay block 360 generates reset signal (rst_rs) on path 365 to reset DIVO 370, and adds a delay to release of reset of divider DIVO 370 based on a delay code received as an input (not shown). Delay block 360 may be implemented in a known way (e.g., using counters).

Divider (DIVO) 370 receives intermediate clock (fvco) on path 335, output (rst_rs) of delay block on path 365, and operates to divide the frequency of fvco by a desired ratio (based on divo_code, 354, specified by user via corresponding means not shown) and thus generate divided (intermediate) clock divo_int on path 375. In the case of a PLL implemented as a ZDB, the ratio is programmed such that the divided output of DIVO 370 has the same frequency as that of the input clock (fin). For example, if the selected input clock fin is operating at a frequency of 1 megahertz (MHz), and the DCO frequency at steady-state is 1 gigahertz (GHz), the divide ratio of DIVO 370 is programmed to be fvco/fin, i.e., 1000. DIVO 370 generates each of successive cycles of clock 375 on counting of a pre-determined number of cycles (desired ratio) of intermediate clock fvco.

Gating block 380 receives output (375) of DIVO 370 and generates the feedback/output clock fout on path 395. Gating block 380 operates to propagate (forward) or gate (not propagate/forward) divided clock (divo_int) as output clock on path 395.

Phase locking block 350 receives input clock 301 (fin), error signal 315 and intermediate clock fvco (335). Phase locking block 350 generates a synchronized divider-reset signal 355 (divo_rst_ff_sync). Phase locking block 350 operates to restart DIVO 370 synchronous with input clock fin in case of PLL 300 implemented as a ZDB with a single output. In implementations of PLL 300 as a ZDB with multiple output clocks, delay block 360 operates to restart each DIVO 370 such that the respective pre-determined phase relationship is obtained upon PLL being out of lock. The implementation details of phase locking block 350 in an embodiment of the present disclosure are provided next.

4. Phase Locking Block

Figure 4A:
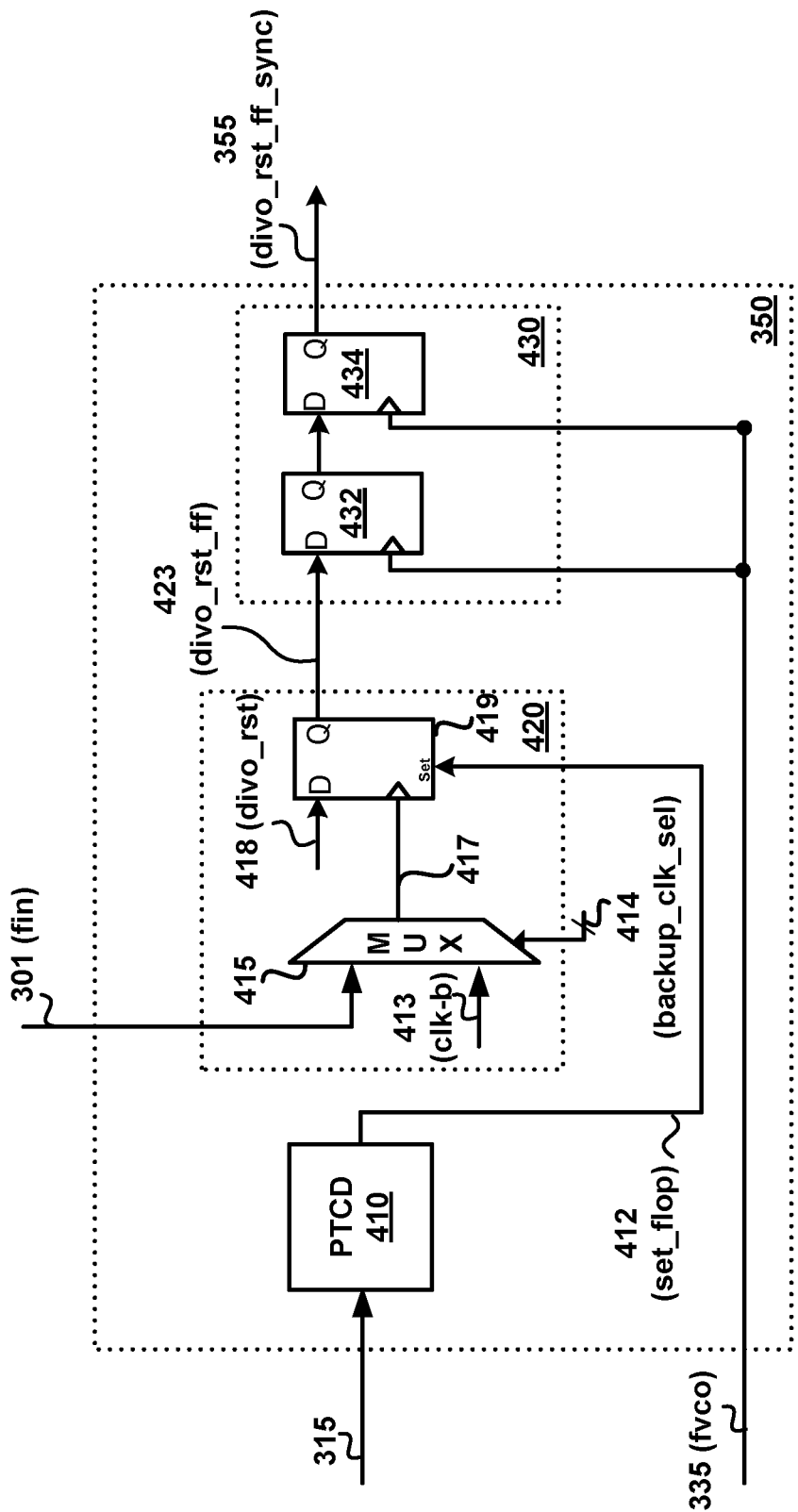
FIG. 4A is a diagram of a phase locking block implemented in an embodiment of the present disclosure.

FIG. 4A is a diagram illustrating the implementation details of a phase locking block in an embodiment of the present disclosure. Phase locking block 350 is shown containing phase threshold crossing detector (PTCD) 410, reset-generator block 420 and synchronizer block 430. Reset-generator block 420 in turn is shown containing multiplexer (MUX) 415 and flip-flop 419. Synchronizer block 430 is shown containing flip-flops 432 and 434. The specific blocks and interconnections of FIG. 4A are shown merely by way of example. More or fewer blocks can be used in other embodiments of the present disclosure. Further, each of blocks 410, 420 and 430 is implemented as a digital unit. However, in other embodiments, some or all of these blocks can be implemented as analog units.

PTCD 410 receives error signal 315, compares the error signal with a pre-determined programmable out-of-lock threshold and generates a control signal (set_flop) on path 412. The threshold value may be provided by user via corresponding means (such as setting value in a register) not shown, and may be based on the specific applications of the PLL. PTCD 410 detects that PLL is out of phase-lock if error signal (315) exceeds the out-of-lock threshold. PTCD 410 also detects that PLL 300 is in frequency-lock (via corresponding means not shown).

In an embodiment, PTCD 410 first detects if PLL is in frequency-lock and if so, proceeds to detect if PLL is out of phase-lock. In other words, locking of phase is sought to be done only after frequency-lock is achieved. If PLL 300 is determined to be not out of phase-lock, PTCD 410 generates a logic LOW on path 412 (set_flop), while if PLL 300 is determined to be out of phase-lock, PTCD 410 generates a logic HIGH on path 412. PTCD 410 provides output of the comparison in a very short duration (compared to one cycle of input clock). In an embodiment, PTCD 410 compares the error signal 315 with the programmed out-of-lock threshold within 100 nanoseconds (ns).

Upon setting set_flop to logic HIGH, PTCD 410 ignores any further crossing of the phase error beyond out-of-lock threshold programmed within PTCD 410 until the current corrective (phase-re-locking procedure) is over. In an embodiment, PTCD 410 is designed to be inactive for a few cycles (e.g., 7 to 8) of fin after setting set_flop. PTCD 410 may be implemented in a known way.

It may be appreciated that during steady-state condition of PLL also, there may be some jitter in the input clock, leading to a non-zero (but near-zero) phase difference. In such cases, it is not desirable for PTCD 410 to generate a logic HIGH on path 412. Accordingly, the out-of-lock threshold is programmed in a manner such that the jitters do not result in generation of a logic HIGH on path 412.

In an alternative embodiment, PTCD 410 may be configured/designed to analyze a certain pre-determined number of consecutive phase errors that each exceeds the out-of-lock threshold, instead of only comparing only one (the present) phase error with the out-of-lock threshold to detect out of phase-lock condition. In such cases, the user may specify (via corresponding means not shown) the pre-determined number of consecutive phase errors to be analyzed. Only if the predetermined number of consecutive phase errors are not in great variance with respect to each other, but all are within some percentage limit of each other, then PTCD 410 generates a logic HIGH on path 412. This implies that phase-lock may be achieved only after some more input clock period durations in addition to the two input clock periods noted herein. Such an operating mode may be particularly helpful when the input clock is very noisy (such as, for example, exhibiting excessive phase-noise).

For example, a user may specify that PTCD 410 must consider three consecutive phase errors (say, Ø1, Ø2 and Ø3), with each error exceeding the out-of-lock threshold and having values within 5% with respect to each other (i.e., Ø1 and Ø2 are within 5% of each other, Ø2 and Ø3 are within 5% of each other and Ø1 and Ø3 are within 5% of each other). It may be appreciated that the phase of input clock fin (301) may undergo several quick (spaced close in time with respect to each other) variations in phase instead of a single change. Accordingly, locking of phase as described in detail herein may be sought to be done only after the phase change has settled to a stable value. When fin 301 is stable after phase change, phase errors following the phase change would exceed the out-of-lock threshold and would be close to each other in value. In the duration that fin 301 is not stable after an initial phase change, phase errors may not be close to each other in value (although each phase error may individually exceed the out-of-lock threshold), and it may not be desirable (at least in some environments) to initiate correction of phase until fin 301 is stable.

Referring to FIG. 4A, reset-generator block 420 receives selected input clock (fin) (output of MUX 305) on path 301 and generates divider-reset signal (divo_rst_ff) on path 423. MUX 415 receives selected input clock (output of MUX 305) on path 301 and a backup clock 413 (clk-b), and forwards one of fin and clk-b on path 417 as an output (MUX output/selected clock) based on the logic value of select signal 414 (backup_clk_sel). clk-b may be generated internally in PLL 300, for example by DCO 330.

In an embodiment, if signal 414 is a logic LOW, clock fin is selected while if signal 414 is a logic HIGH, clk-b is selected to be output on path 417. Signal 414 may be set to a logic HIGH upon detecting a failure of the currently used input clock (fin), as described below in detail with respect to FIG. 6.

Flip-flop 419 is clocked by clock 417 (output of MUX 415). Flip-flop 419 receives set signal (set_flop) on path 412 at its asynchronous 'Set' terminal, input signal (D) (divo_rst) on path 418 at its D input, and generates output (Q), divo_rst_ff, on path 423. If the value of set_flop 412 is a logic HIGH, the output (Q) of flip-flop 419 is a logic HIGH. If the value of set_flop 412 is a logic LOW, input signal 418 is transferred to output on path 423, at the rising (positive) edge of clock 417.

Synchronizer block 430 receives divider-reset signal (divo_rst_ff) on path 423 and intermediate clock fvco on path 335, and generates synchronized divider-reset signal (divo_rst_ff_sync) on path 355. Each of flip-flops 432 and 434 of synchronizer block 430 is clocked by fvco (335). Accordingly, signal 423 (divo_rst_ff) is delayed by two clock cycles of fvco before being output on path 355. Thus, synchronizer block 430 operates to synchronize divider-reset signal divo_rst_ff (423) with fvco (335), thereby generating a synchronized divider-reset signal on path 355. Synchronizer block 430 reduces the probability of errors due to metastability since signal 423 is typically asynchronous with respect to fvco. Also, synchronizer block 430 eliminates unequal probabilities of metastability across multiple output blocks (such as blocks 785-*x* of FIG. 7) due to potentially unequal propagation delays in signal 423 reaching such output blocks. The implementation details of output block 385 in an embodiment of the present disclosure are provided next.

5. Output Block

Figure 4B:
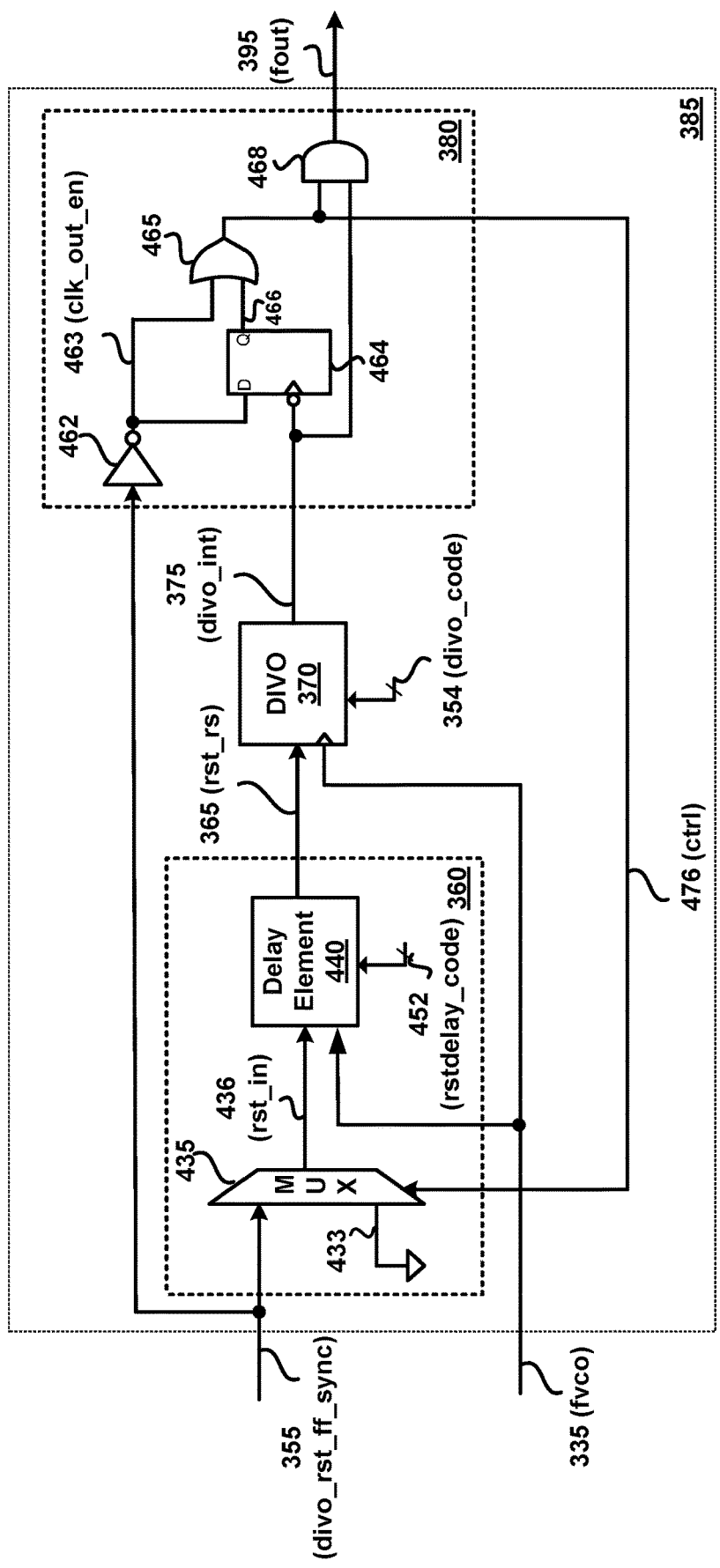
FIG. 4B is a circuit diagram of an output block implemented in an embodiment of the present disclosure.

FIG. 4B is a block diagram illustrating the implementation details of an output block in an embodiment of the present disclosure. Output block 385 is shown containing MUX 435, delay block 360, divider (DIVO) 370 and gating block 380. DIVO 370 corresponds to that shown in FIG. 3 and the description is not repeated here in the interest of brevity. Delay block 360 in turn is shown containing MUX 435 and delay element 440. Gating block 380 is shown containing inverter 462, flip-flop 464, OR gate 465 and AND gate 468. The specific blocks and interconnections of FIG. 4B are shown merely by way of example. More or fewer blocks can be used in other embodiments of the present disclosure. Further yet, logical gates OR (465) and AND (468) may be implemented as universal gates (NAND and NOR), as will be apparent to a skilled practitioner by reading the disclosure provided herein.

MUX 435 receives synchronized divider-reset signal (355) and a constant reference potential (ground) 433, and forwards one of synchronized divider-reset signal and logic LOW (ground) on path 436 as an output (MUX output/selected signal, rst_in) based on the logic value of select signal 476 (ctrl). Select signal 476 is received from gating block 380, as will be described below. In an embodiment, if the value of ctrl signal (476) is a logic LOW, synchronized divider-reset signal is selected while if ctrl signal (476) is a logic HIGH, logic LOW (ground) is selected to be output on path 436 (rst_in).

Delay element 440 receives MUX output (rst_in) on path 436, intermediate clock (fvco) on path 335 and a delay code (rstdelay_code) on path 452. Delay element 440 generates delayed divider-reset signal based on rstdelay_code 452. In other words, a pre-determined programmable number (rst-delay_code) of intermediate clock (fvco) cycles may be programmed to be delayed before DIVO 370 starts dividing intermediate clock fvco. In an embodiment, DIVO 370 is designed such that if the value of rst_rs signal received on path 365 is a logic HIGH, output (375) of DIVO is held at logic HIGH for the duration that rst_rs is HIGH. If the value of rst_rs signal received on path 365 is a logic LOW, output (divo_int, 375) of DIVO 370 goes LOW after counting a number of fvco cycles equal to half of that specified in divo_code (354), and then goes HIGH after counting a number of fvco cycles equal to half of that specified in divo_code (354), thus realizing a divided clock (intermediate) clock divo_int (375).

Gating block 380 receives synchronized divider-reset signal (divo_rst_ff_sync) on path 355, divided (intermediate) clock on path 375 (divo_int) and generates output clock 395 (fout). Gating block 380 also generates control (ctrl) signal on path 476. Flip-flop 464 is clocked by divided (intermediate) clock 375. In an embodiment, flip-flop 464 is negative edge triggered. Gating block 380 operates to propagate (forward) or gate (not propagate/forward) divided clock (divo_int) as output clock on path 395 and provides output clock without glitches, as will be described next with respect to FIG. 5.

6. Locking Phase of a PLL Upon being Out of Lock

Figure 5:
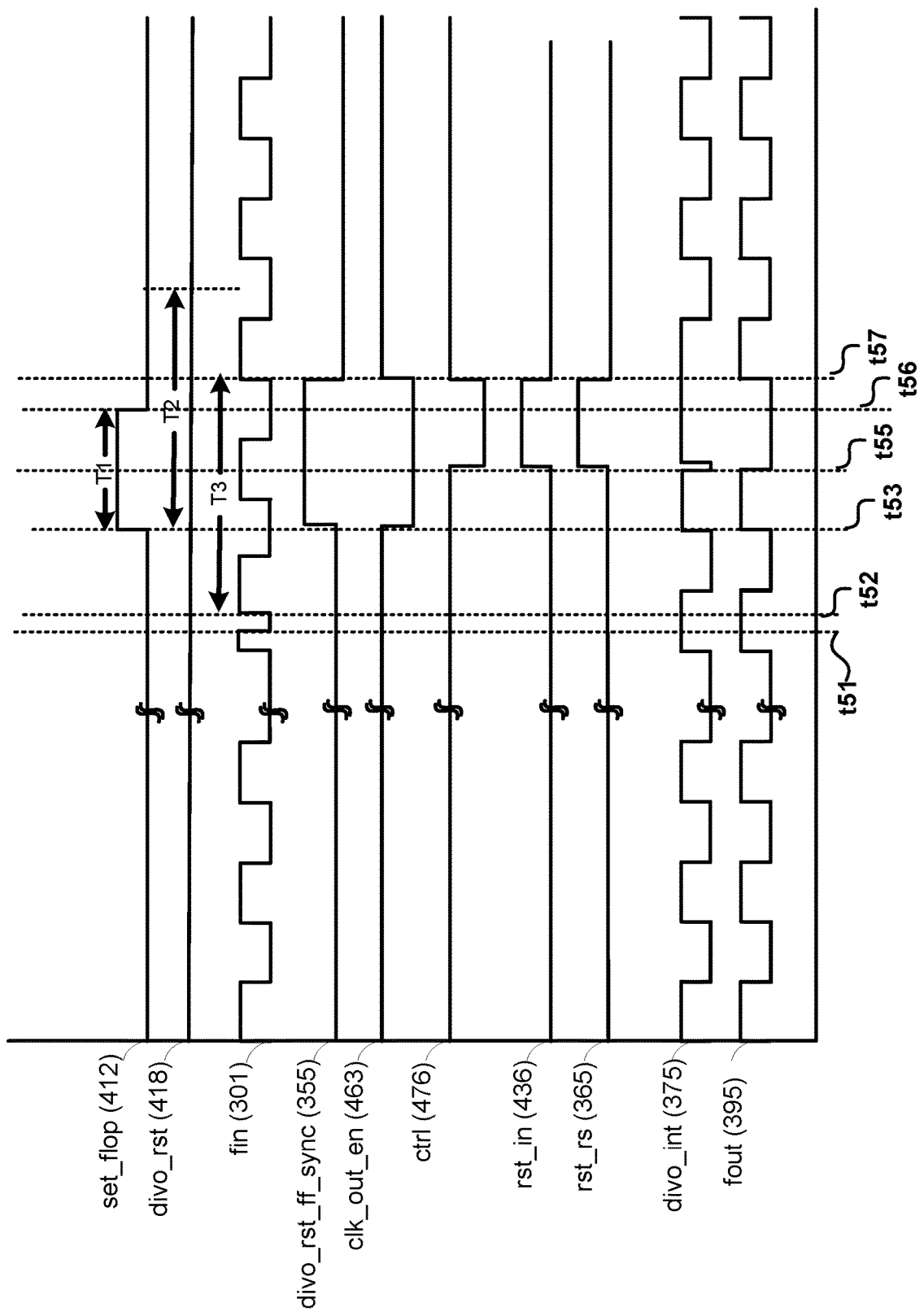
FIG. 5 is a timing diagram illustrating the manner in which duration of locking phase is minimized, in an embodiment of the present disclosure.

FIG. 5 is a timing diagram illustrating waveforms at various nodes of a PLL, in an embodiment of the present disclosure. FIG. 5 shows example waveforms of set_flop 412, divo_rst 418, fin 301, divo_rst_ff_sync 355 (all of FIG. 4A), clk_out_en 463, ctrl 476, rst_in 436, rst_rs 365, divo_int 375 and fout 395 (all of FIG. 4B). In the illustrative embodiment, signal divo_rst 418 is held at logic LOW at all times. In the description of FIG. 5, it is assumed that the value of rstdelay_code (452) is zero, implying zero delay.

PLL 300 is in steady-state until time t51. Thus, prior to t51, signals fin 301 and fout 395 are in frequency-lock and phase-lock, and magnitude of error signal 315 (not shown) is less than the "steady-state threshold". Consequently, PTCD 410 (FIG. 4A) generates a logic LOW on path 412 (set_flop). It is assumed that in steady-state, signal 414 (backup_clk_sel) is at logic LOW. Therefore, clock fin 301 is shown as having been selected as the output of MUX 415. Since signal 412 (set_flop) is at logic LOW (as noted above), input signal 418 is transferred to output on path 423 (not shown) at the rising (positive) edge of clock 417 (here, fin 301). Thus, output (divo_rst_ff 423) of flip-flop 419 is a logic LOW. Synchronized divider-reset signal (divo_rst_ff_sync) on path 355 is at logic LOW.

In steady-state, signal 355 being inverted by inverter 462 is at logic HIGH on path 463 (clk_out_en). Ctrl 476 (output of OR gate 465) is therefore a logic HIGH. As a result, MUX 435 selects logic LOW (ground) to be output on path 436 (rst_in). Delay element 440 forwards the value of rst_in on path 365 (rst_rs) synchronous with intermediate clock fvco (335). DIVO 370 generates each of successive cycles of output 375 on counting of a pre-determined number of cycles of intermediate clock fvco. Flip-flop 464 transfers signal 463 on to path 466, at corresponding negative edges of divo_int. As noted previously, input 476 (ctrl) of AND gate 468 is at logic HIGH. The other input of AND gate is output of DIVO 375 (a divided clock waveform, divo_int). Thus, AND gate propagates (forwards) divided clock divo_int (375) as output fout (395). Fout 395 is provided as feedback clock to phase-to-digital converter 310.

At t52, input clock (fin) 301 has a change in phase (depicted by a step change to logic LOW at t51 and then to logic HIGH in FIG. 5). It may be observed that had there not been a change in phase, the next positive edge would have occurred at t53, but due to change in phase of input clock (fin, 301), the edge has occurred earlier (i.e., at t52). As a result, fout 395 loses phase-lock with fin 301 starting at t52. Consequently, magnitude of error signal 315 rises from its previous value, corresponding to the (present) phase difference between fin 301 and fout 395. Any change in frequency of fin 301 starting at t52 would be detected only after comparing the phase of input clock (fin, 301) with the phase (positive edge) of feedback clock (fout, 395), which is at t53. Due to the small loop BW of PLL 300, any change in frequency of fout due to the change in phase of fin would typically require a large time interval. Hence, no change in frequency of fout 395 is shown as having occurred, and fout continues to be in frequency-lock with respect to fin 301.

At t53 or slightly later (depending on the specific implementation of block 310), the magnitude of error 315 is determined to exceed the pre-determined programmable phase threshold. In response, PTCD 410 generates a logic HIGH on path 412 (set_flop) and holds it at logic HIGH for a full period (indicated by duration T1 in FIG. 5) of input clock fin. In an embodiment, the value of the time period of fin is stored in digital filter 320, and a pre-determined number of clock cycles of an internal reference clock (not shown) is counted to derive one clock period (here, T1) of fin 301. At the instant that set_flop (412) is asserted (to logic HIGH), a counter (not shown) within digital filter 320 is started to count the pre-determined number of cycles of the internal reference clock, and set_flop (412) is de-asserted after counting the pre-determined number. For example, if the internal reference clock has a frequency of 50 Mega-Hertz (MHz) and fin has a frequency of 1 Hertz (Hz), then 50 million edges of the internal reference clock are counted to derive T1. After counting 50 million edges, set_flop (412) is de-asserted.

At t53, in addition to starting the counter for a duration of one period (T1) of fin 301, a second counter for a duration of two periods (indicated by duration T2 in FIG. 5) of fin 301 is also started. By the end of T2, if at least one positive edge of fin is not detected at input of MUX 415, fin 301 is deemed to have failed.

Asserting set_flop for T1 duration (fin period), is done with a view to ensuring that DIVO 370 will be reset and successfully restarted with new phase of fin. As a result, divo_rst_ff (423) (output of flip-flop 419), and hence divo_rst_ff_sync (355) goes to logic HIGH. clk_out_en 463 correspondingly goes to logic LOW (being inverted by inverter 462). Flip-flop 464 receives logic LOW on path 463 (clk_out_en).

At t55, upon receiving the next negative edge of divo_int (375), output 466 of flip-flop 464 goes to logic LOW. Thus, output (ctrl 476) of OR gate goes to logic LOW (as both inputs to the OR gate are now at logic LOW). Consequently:

(1) MUX 435 selects divo_rst_ff_sync (355) (which is at logic HIGH at t55) to be output on path 436 (rst_in), and as a result, rst_rs (365) and divo_int (375) go to logic HIGH. DIVO 370 is thus reset.

(2) Output (fout, 395) of AND gate goes LOW (as one of the inputs, 476, is at logic LOW).

It may be appreciated that the techniques described herein (specifically the use of gating block 380) ensures that fout does not exhibit any glitch (logic state excursions) when DIVO 370 is reset after the phase change at input clock (fin, 301) is detected. Any glitch at fout could cause problems to any glitch-sensitive downstream systems/circuits using fout (395).

It may be appreciated that AND gate 468 operates to forward divo_int 375 when PLL 300 is in phase-lock, and to not forward divo_int 375 when PLL 300 is out of phase-lock. In other words, output clock (395) of PLL 300 is gated at logic LOW as soon as DIVO 370 is reset (stops generating divided clock; and output of DIVO 370 is held at logic HIGH when DIVO is reset). Thus, by gating output clock (395) to a fixed value (logic LOW in this case) for a portion (t55-t57) of duration (t52-t57) in which PLL 300 is out of phase-lock, glitches (as noted above) in output clock (395) may be avoided.

As noted above, PTCD 410 is designed to ignore any further crossings of the programmed phase error threshold until the current corrective (phase-re-locking procedure) is over.

As noted above, set_flop 412 is held it at logic HIGH for one period of input clock fin. Thus, at t56 (at the end of one period of fin), set_flop 412 goes to logic LOW. As a result, flip-flop 419 is ready to output divo_rst 418 (held at logic LOW at all times) at the next rising (positive) edge of input clock fin (395).

At t57, when the next rising (positive) edge of fin arrives (before the end of T2), divo_rst_ff 423 goes to logic LOW. In other words, div_rst_ff 423 going to logic LOW (i.e., reset release) is synchronous with respect to the rising edge of input clock fin 301. As a result, divo_rst_ff_sync (355) goes to logic LOW after 2 cycles of fvco. Correspondingly, clk_out_en 463 goes to logic HIGH, leading to ctrl 476 going to logic HIGH. Logic HIGH on path ctrl (476) causes MUX 435 to forward logic LOW (ground) on path 436 (rst_in). Consequently, at t57, synchronous with the rising edge of fin 301, signal rst_rs (365) is set to logic LOW, thereby enabling (re-starting) DIVO 370. Thus, delay block 360 releases the reset and causes DIVO 370 to start dividing fvco again starting at t57. Hence, in FIG. 5, DIVO 370 is shown as dividing fvco (starting at t57) to generate divo_int (375).

Inputs to AND gate are now a logic HIGH (ctrl 476) and the divided clock waveform (divo_int). Therefore, gating block 380 resumes generating output clock fout (395) at t57, with phase of fout being aligned with the new phase of fin (fout in phase-lock with fin). PLL 300 resumes steady-state operation starting at t57.

It may be appreciated that phase of output clock is locked with phase of input clock within two cycles of input clock (as indicated by duration T3 in FIG. 5—interval t52-t57) from the instant loss of phase-lock is detected. Also, since the output clock is gated to a fixed value (a logic LOW in the illustrative embodiment) during reset of DIVO 370, output clock fout (395) is free of glitches.

Therefore, phase-relock of fout is achieved within two cycles of fin from the instant of detection of loss-of-phase-lock. Such a capability, while desirable in all or most environments/applications, may be of particular benefit when a PLL is implemented as a zero-delay buffer (ZDB). As noted above, ZDB are usually implemented to have very small loop BW. Consequently, at least in the context of ZDB, and generally for low frequencies (such as, for example, less than around 10 MHz) of input clock fin, phase relock duration may be of the order of several minutes to hours for example, when loop bandwidth is of the order of a few milli-Hertz without the techniques of the present disclosure.

Although locking of phase has been illustrated with respect to PLL going out of phase-lock (while maintaining frequency-lock) after a steady-state of operation due to a change in phase of input clock, aspects of the present disclosure are applicable when, for example, PLL is powered-ON/reset or when PLL switches (based on user input or from an external device) from one input clock to another with the same/different frequency.

According to another aspect of the present disclosure, even upon failure (loss or absence) of input clock (e.g., if the connection of the PLL to the input clock is broken) after a change in phase of input clock, output clock fout is continued to be generated as if input clock were present. An example technique to achieve this objective is described in detail with respect to FIG. 6.

Figure 6:
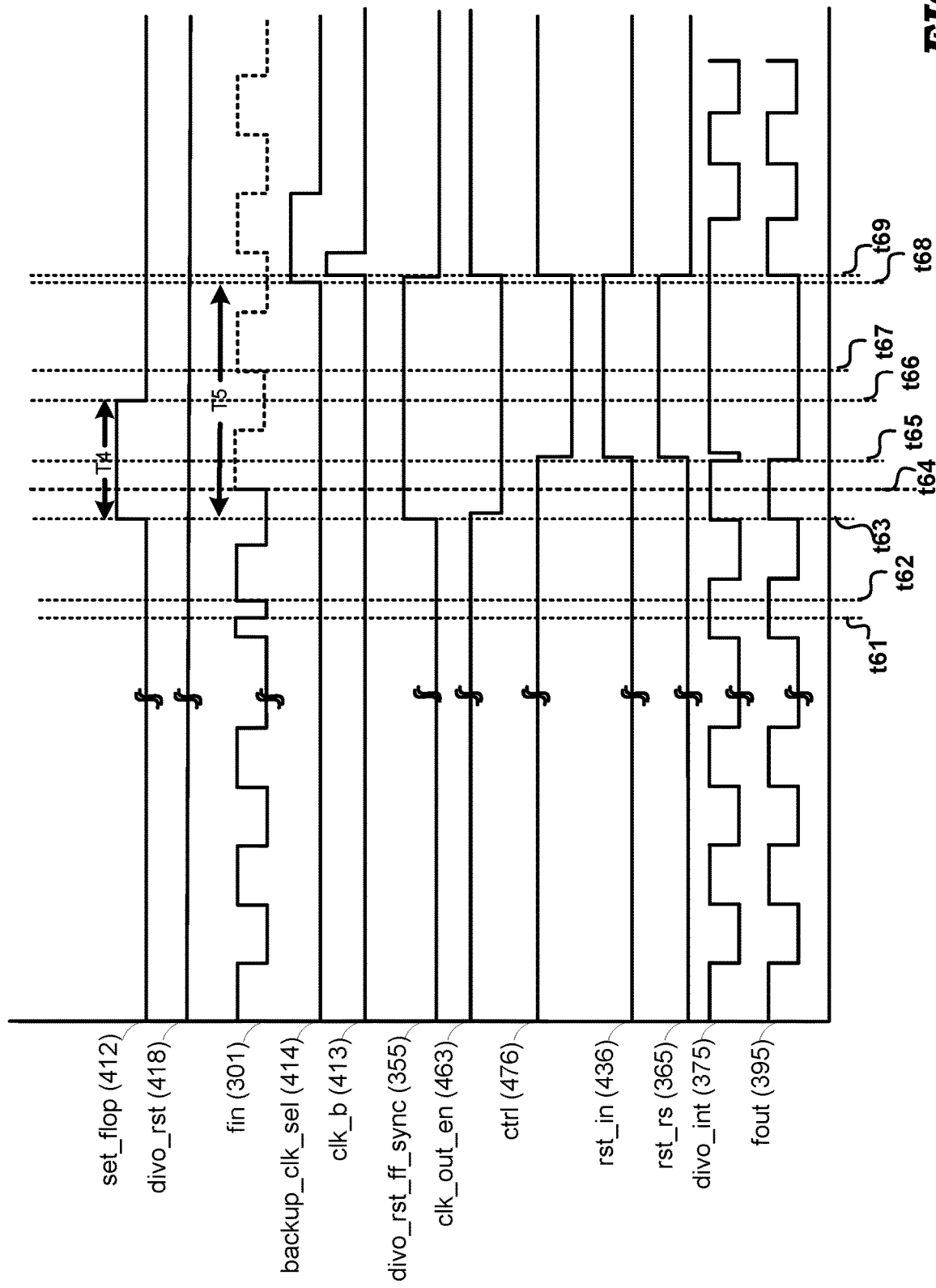
FIG. 6 is a timing diagram illustrating the manner in which output clock continues to be generated when input clock fails after change in phase, in an embodiment of the present disclosure.

7. Continuing to Generate Output Clock Upon Failure of Input Clock After Change in Phase of Input Clock FIG. 6 is a timing diagram (not to scale) illustrating waveforms at various nodes of a PLL, in an embodiment of the present disclosure. The signals of FIG. 6 correspond to those of FIG. 5. Additionally, FIG. 6 shows example waveforms of signals backup_clk_sel (414) and clk_b (413). Only the differences from the waveforms of FIG. 5 are described here with respect to FIG. 6 in the interest of brevity. In the description of FIG. 6, it is assumed that the value of rstdelay_code (452) is zero, implying zero delay.

Generation of clk-b may begin after a pre-determined duration of time after set_flop 412 is asserted HIGH by PTCD 410. In an embodiment, clk-b is generated after two input clock periods (from the time set_flop is asserted HIGH), the two clock period duration being calculated internally using a precise reference clock as a counter (not shown). Therefore, in case of input clock functioning normally (without failure) as described with respect to FIG. 5, input clock (fin, 301) edge arrives before the first edge of the freshly generated clk-b (413) edge, and restarts output divider DIVO 370 in a synchronous manner. But in case of failure (loss/absence) of input clock (fin, 301), clk-b (413) triggers DIVO 370 so that output clock (fout, 395) does not become non-functional (absent, not toggling, etc.) in the absence of input clock (fin, 301).

Referring to FIG. 6, PLL 300 is in steady-state until time t61. Thus, prior to t61, signal backup_sel_clk (414) is at logic LOW, indicating no failure of input clock fin. Clk_b (413) is shown to be at logic LOW.

At t62, fin 301 has a change in phase (depicted by a step change to logic LOW in FIG. 6). The behavior of PLL during t61-t66 corresponds to that in time duration t51-t56 of FIG. 5 and the description is not repeated here in the interest of conciseness, except that between time t63-t65, input clock fin fails. Thus, fin 301 is not valid or active in the portion shown in FIG. 6 as indicated by the dotted line.

At t63, as noted above with respect to FIG. 5, in addition to starting a counter (e.g., the same counter as that used to generate T1 of FIG. 5) for a duration of one period (T4, which is also equal to T1 of FIG. 5) of fin 301, a second counter for a duration of two periods (T5, which is also equal to T2 of FIG. 5) of fin 301 is also started. By the end of T5, if at least one positive edge of fin (which ought to have occurred at t64 or t67 had fin not failed) is not detected at input of MUX 415, fin 301 is deemed to have failed.

At t67, the expected rising edge of input clock fin (301) is not received at flip-flop 419. Therefore, divo_rst_ff_sync (355) continues to be at logic HIGH (DIVO 370 continues to be in reset, and hence divo_int 375 continues to be at logic HIGH), and correspondingly clk_out_en (463) and ctrl (476) continue to be at logic LOW. Therefore, output clock fout continues to be held at logic LOW.

At t68 (at the end of two periods of fin 301 since the time instant of asserting HIGH on path 412, set_flop), backup_sel_clk (414) is set to logic HIGH. As a result, MUX 415 selects clk_b 413 to be output on path 417, thereby creating a pulse (or one rising edge) on path 417 at t69 in order to re-start DIVO 370.

At t69, synchronous with the rising edge of clk_b (413), flip-flop 419 transfers signal 418 (logic LOW) on paths 423 and 355, thereby releasing reset of DIVO 370. Consequently, DIVO 370 starts counting edges of intermediate clock (fvco) starting at t69. As noted above with respect to FIG. 5, inputs to AND gate are now a logic HIGH (ctrl 476) and the divided clock waveform. Therefore, gating block 380 resumes generating output clock fout (395) at t69. In this manner, even after a failure of input clock following a change in phase of input clock, output clock fout 395 is continued to be generated as if input clock were present. In the embodiment described with respect to FIG. 6, fout 395 is restarted two input-clock-cycle-duration following detection of loss-of-phase-lock (i.e., when set_flop 412 is asserted). In alternative embodiments, even if fin does not fail after change in phase of fin, clk_b may still be asserted at t69 for redundancy (in case the circuit used to detect failure of fin fails).

According to another aspect of the disclosure, multiple output clocks may be re-aligned in phase upon the PLL being out of phase-lock. An example technique to achieve this objective is described in detail with respect to FIGS. 7 and 8.

8. Aligning Phases of Multiple Output Clocks

Figure 7:
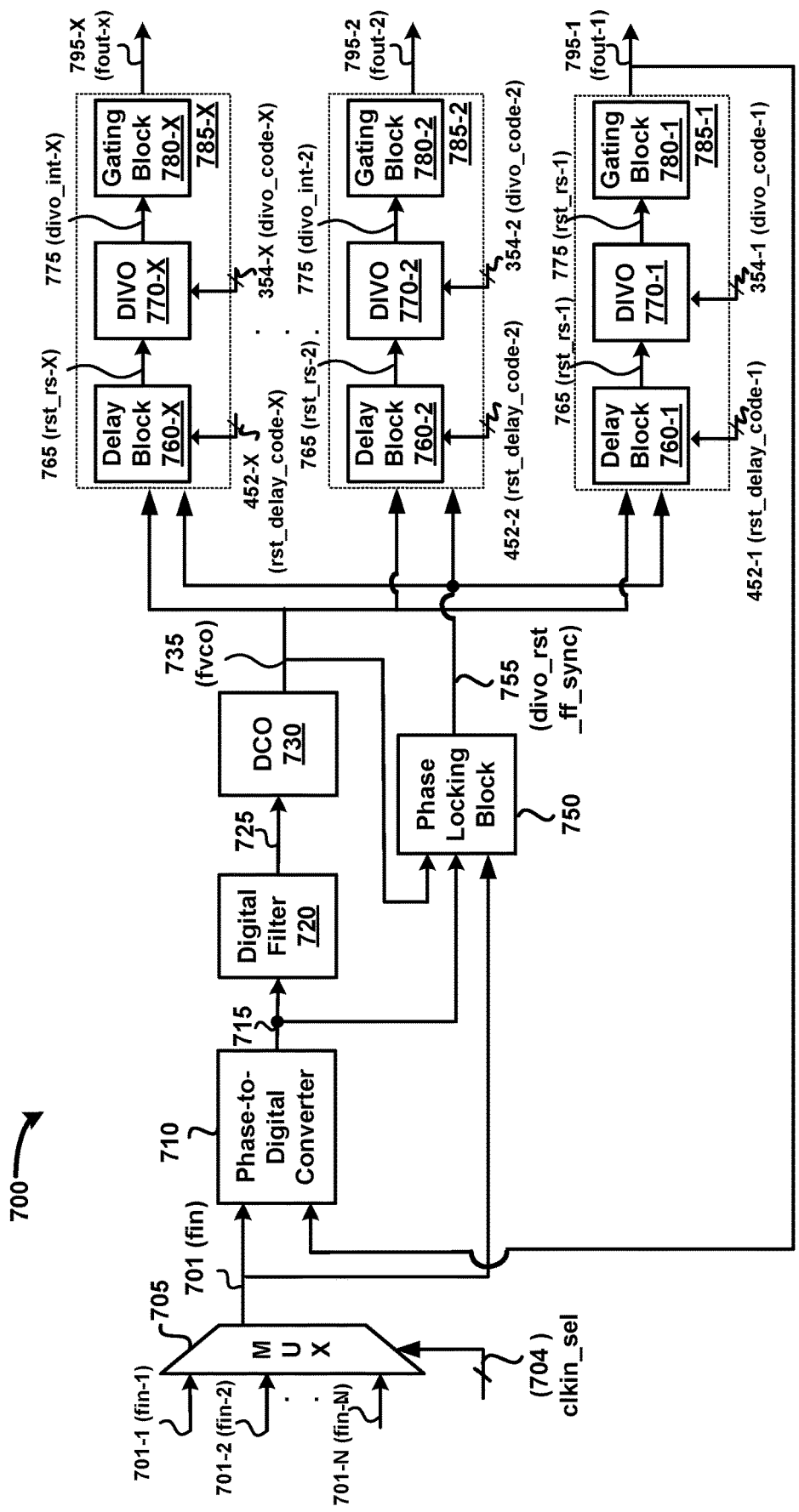
FIG. 7 is a block diagram of a PLL with multiple output blocks, in an embodiment of the present disclosure.

FIG. 7 is a block diagram of a PLL with multiple output blocks, in an embodiment of the present disclosure. PLL 700 is shown containing input clocks 701-1 (fin-1) through 701-N (fin-N), MUX 705, phase-to-digital converter 710, digital filter 720, oscillator (DCO) 730, phase locking block 750 and output blocks 785-1 through 785-X (X representing any natural number). Output block 785-1 in turn is shown containing delay block 760-1, divider (DIVO) 770-1 and gating block 780-1. Output block 785-2 in turn is shown containing delay block 760-2, divider (DIVO) 770-2 and gating block 780-2. Output block 785-X in turn is shown containing delay block 760-X, divider (DIVO) 770-X and gating block 780-X.

Components 705, 710, 720, 730, 750, 760, 770 and 780 respectively correspond to components 305, 310, 320, 330, 350, 360, 370 and 380 of FIG. 3 and their description is not repeated here in the interest of conciseness. Similarly, signals 701-1 to 701-N, 701, 715, 725, 735 and 755 respectively correspond to signals 301-1 to 301-N, 301, 315, 325, 335 and 355 of FIG. 3 and their description is not repeated here in the interest of conciseness. Output blocks, delay blocks, dividers and gating blocks are collectively or individually referred to by 785, 760, 770 and 780 respectively, as will be clear from the context. Signals rstdelay_code, divo_code, synchronized divider-reset and divided (intermediate) clock are collectively or individually referred to by 452, 354, 765 and 775 respectively, as will be clear from the context.

Each delay block 760 receives a respective delay code (rstdelay_code) on path 452 (via a user input path, not shown), and is thus programmed to generate the corresponding delay between its input and its output. Each delay block 760 generates a respective synchronized divider-reset signal (rst_rs) based on the corresponding delay code 452. In other words, upon being released from reset, an additional delay of a pre-determined number (rstdelay_code, 452) of intermediate clock (fvco) cycles is introduced to signal rst_in (436) before the corresponding divider DIVO 770 starts dividing intermediate clock fvco (335). Each delay block includes a respective MUX (not shown in FIG. 7) that generates a corresponding rst_in signal (736, also not shown in FIG. 8), as described in detail with respect to FIG. 4B.

Each divider (DIVO) 770 receives a respective divider code (divo_code) on path 354 (via a user input path, not shown). Accordingly, each divider generates a respective divided intermediate clock (divo_int, 775), based on divo_code. In this illustrative embodiment, each output clock 795 is shown as having the same frequency as input clock fin 701. However, in alternative embodiments, all except one divided intermediate clock (which is used as the feedback clock) can have frequencies other than that of fin. Each gating block 780 forwards divided intermediate clock as a corresponding output clock fout 795 when PLL 700 is in phase-lock, and gates (does not forward) divided intermediate clock upon PLL 700 being out of phase-lock. Thus, each output block 785 generates a respective output clock 795.

Figure 8:
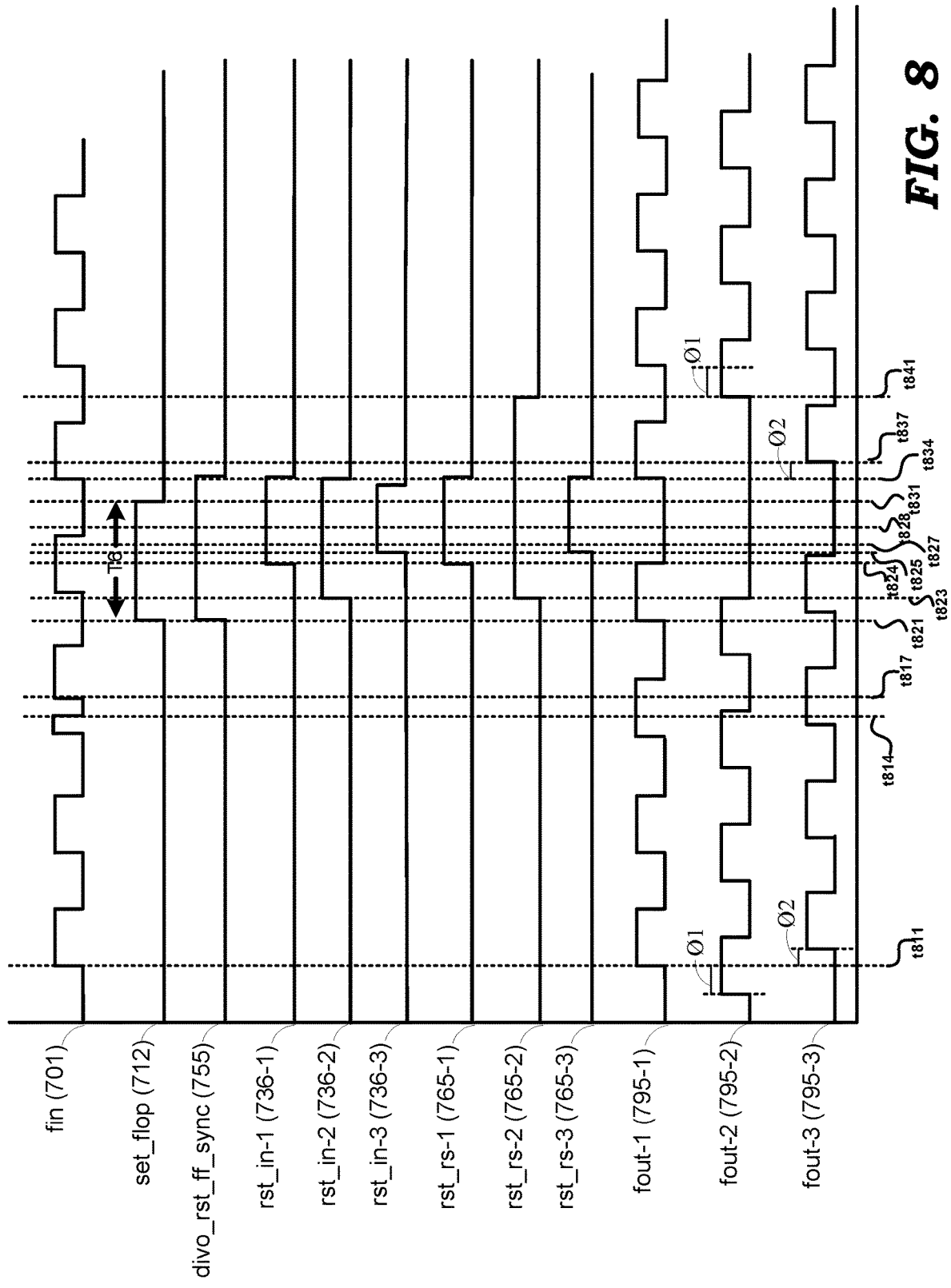
FIG. 8 is a timing diagram illustrating the manner in which phase is re-aligned for each output clock, in an embodiment of the present disclosure.

Each output clock 795 may have a pre-determined phase relationship (based on the corresponding rstdelay_code) with respect to input clock fin (701), with any one of the output clocks having zero phase difference with respect to fin and which is used as the feedback clock provided to phase-to-digital converter 710. In the embodiment of FIGS. 7 and 8, output clock 795-1 is in-phase (zero phase difference) with respect to fin (701), and is shown to be used as feedback clock (provided as input to phase-to-digital converter 710).

According to an aspect of the present disclosure, each output block may be provided with an option to respond to (take corresponding corrective action) or disregard (take no action) output 755 of phase locking block (750). In an embodiment, a select-bit may be provided by user (via corresponding means not shown), and 755 may be gated by the select-bit using suitable logic, and the output of the gated logic is connected to each delay block (785). Thus, if select-bit for an output block (say, 785-4) is programmed to disregard signal 755, then output block 785-4 may continue to operate without re-starting DIVO 770-4 despite PLL 700 being out of phase-lock. The PLL's feedback loop will re-align phase of output block 785-4 with respect to input clock fin (701) upon fout-4 losing its pre-determined phase relationship with respect to fin (701) by action of the PLL feedback loop rather than the techniques described herein. However, if select-bit for output block 785-4 is programmed to respond to signal 755, then output block 785-4 operates to re-align phase of fout-4 with respect to fin 701 according to techniques of the present invention.

The manner in which multiple output clocks may be re-aligned in phase upon PLL being out of lock, according to various aspects of the present disclosure, is described next with respect to FIG. 8. FIG. 8 is a timing diagram illustrating the manner in which multiple output clocks are re-aligned in phase upon PLL being out of phase-lock in an embodiment of the present disclosure. In particular, the timing diagram shows example waveforms of fin (701), set_flop (712), divo_rst_ff_sync (755), rst_in-1 (736-1), rst_in-2 (736-2), rst_in-3 (736-3), rst_rs-1 (765-1), rst_rs-2 (765-2), rst_rs-3 (765-3), fout-1 (795-1), fout-2 (795-2) and fout-3 (795-3). Signals 735 (fvco) (not shown) and 755 (divo_rst_ff_sync) are provided commonly to all output blocks 785.

PLL 700 is in steady-state until time t814. Thus, prior to t814 (for example, at t811), fout-1 (795-1) is shown to having zero phase difference with respect to fin (701), fout-2 (795-2) is shown to be leading with respect to fin (701) by phase Ø1, and fout-3 (795-3) is shown to be lagging with respect to fin (701) by phase Ø2. In other words, rstdelay_code 452-1 is programmed to be zero, rstdelay_code 452-2 is programmed to be (2π minus Ø1), and rstdelay_code 452-2 is programmed to be (+Ø2).

At t814, input clock fin 701 has a change in phase. As a result, each of fout-1 795-1, fout-2 795-2 and fout-3 795-3 goes out of phase-lock with fin 701. In other words, the respective pre-determined phase relationship of each output clock with respect to input clock is lost. PLL 700 being out of phase-lock is detected at t817, and in response, signals set_flop (712) and divo_rst_ff_sync (755) are generated as described above with respect to FIG. 5. Thus, starting from t821, set_flop (712) is shown as remaining at logic HIGH for one period (shown as duration T6, which is also equal to T1 of FIG. 5) of fin (701).

At the next negative edge of respective DIVO 770, corresponding rst_in signals go to logic HIGH. Thus, rst_in-1 is shown to be at logic HIGH starting at t824, rst_in-2 is shown to be at logic HIGH starting at t823, and rst_in-3 is shown to be at logic HIGH starting at t825. It may be appreciated that the assertion of each rst_in signal is delayed by the corresponding pre-determined phase relationship of DIVO 770.

Each rst_in signal is delayed to be output as respective rst_rs signal based on corresponding rstdelay_code of each DIVO 770. Thus, rst_rs-1 goes to logic HIGH at t824 (without any delay with respect to rst_in-1), DIVO 770-1 is reset and correspondingly fout-1 is shown to be gated immediately following reset of DIV 770-1. Rst_rs-2 goes to logic HIGH at t823, DIVO 770-2 is reset, and correspondingly fout-2 is shown to be gated immediately following reset of DIV 770-2. Rst_rs-3 goes to logic HIGH at t825, DIVO 770-3 is reset, and correspondingly fout-3 is shown to be gated immediately following reset of DIV 770-3.

At t831, (at the end of one period, T6, of fin), set_flop 712 goes to logic LOW. At t834, synchronous with the next rising (positive) edge of fin 701, div_rst_ff goes to logic LOW, and as a result divo_rst_ff_sync (755) goes to logic LOW after 2 cycles of fvco. Each rst_in signal (736-1, 736-2, 736-3) accordingly goes to logic LOW at t834.

As noted above, each rst_rs signal (765) is delayed to be output as respective rst_in signal (736). Accordingly, rst_rs-1 goes to logic LOW at t834 (without any delay with respect to rst_in-1), and signals rst_rs-2 and rst_rs-3 go to logic LOW after corresponding delays, at t837 and t841 respectively. Each rst_rs-1 signal releases corresponding DICO 770 from reset, and each DIVO 770 starts dividing fvco to generate corresponding fout (795).

Consequently, output clocks fout-1 (795-1), fout-2 (795-2) and fout-3 (795-3) are forwarded at respective time instants (t834, t841 and t837). In other words, gating block 780-1 resumes generating output clock fout-1 (795-1), with phase of fout-1 (795-1) being aligned with phase of fin (fout-1 in phase-lock with fin). Similarly, gating block 780-3 resumes generating output clock fout-3 (795-3), with phase of fout-3 (795-3) lagging phase of fin by Ø2. Gating block 780-2 resumes generating output clock fout-2 (795-2), with phase of fout-2 (795-2) leading phase of fin by Ø1.

Thus, although each output block 785 receives a common synchronized divider-reset signal divo_rst_ff_sync (755), each divider (DIVO 770) is released from reset at different time instants, thereby resuming counting of respective predetermined edges of intermediate clock (fvco). In this manner, PLL 700 operates to re-align phases of multiple output clocks upon PLL 700 being out of lock.

Aspects of the present disclosure enable a PLL to obtain phase-lock of an output clock with respect to input clock upon going out of phase-lock. PLL 300/700 implemented as described above can be incorporated in a larger device or system as described briefly next.

9. System

Figure 9:
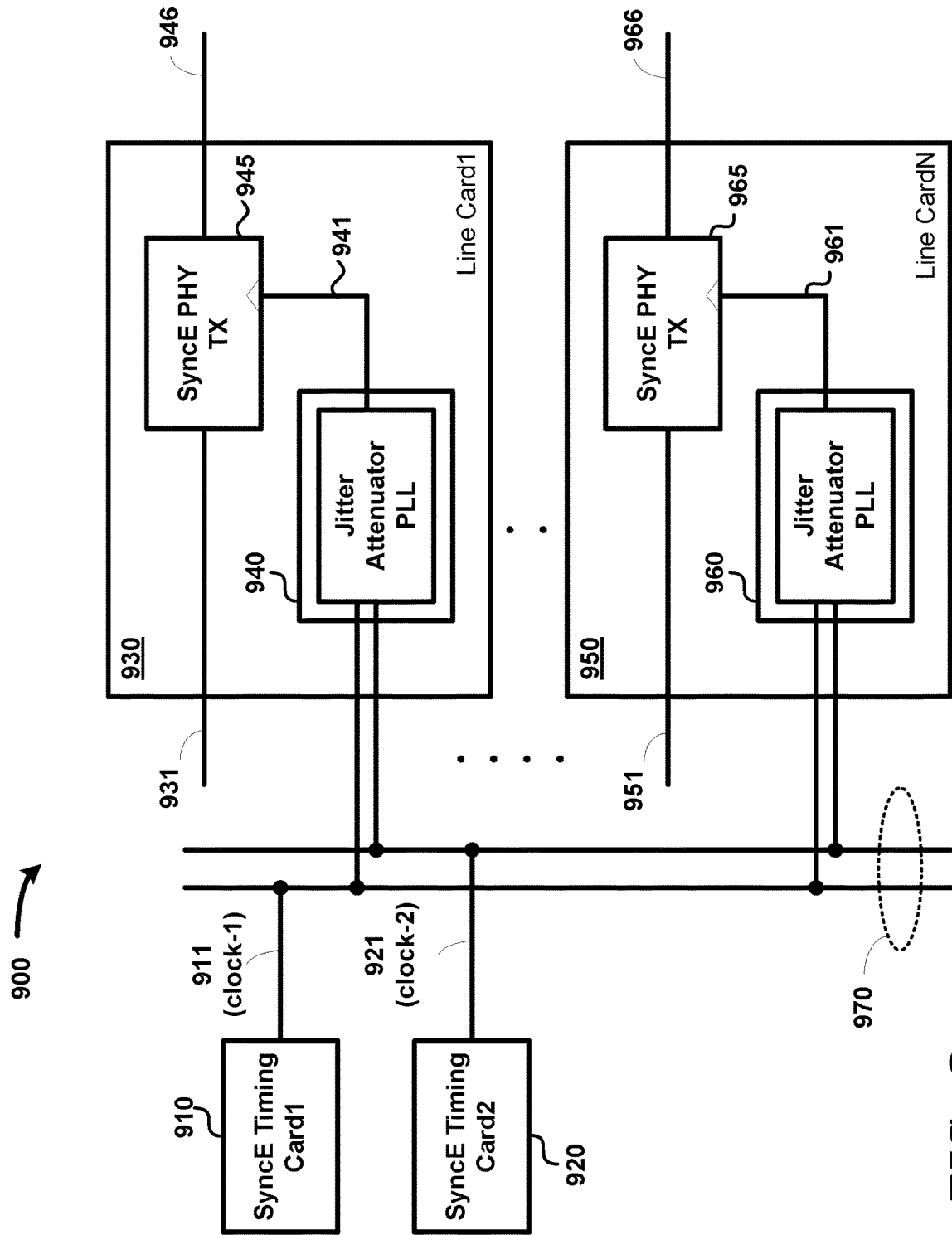
FIG. 9 is a block diagram of a system in which a device implemented according to several aspects of the present disclosure can be incorporated, in an embodiment of the present disclosure.

FIG. 9 is a block diagram of an example system containing a PLL implemented according to various aspects of the present disclosure, as described in detail above. System 900 is shown containing SyncE (Synchronous Ethernet) timing cards (910 and 920) and line cards 1 through N, of which only two line cards 930 and 950 are shown for simplicity. Line card 930 is shown containing jitter attenuator PLL 940 and SyncE PHY Transmitter 945. Line card 950 is shown containing jitter attenuator PLL 960 and SyncE PHY Transmitter 965. The components of FIG. 9 may operate consistent with the Synchronous Ethernet (SyncE) network standard. As is well known in the relevant arts, SyncE is a physical layer (PHY)-based technology for achieving synchronization in packet-based Ethernet networks. The SyncE clock signal transmitted over the physical layer should be traceable to an external master clock (for example, from a timing card such as card 910 or 920). Accordingly, Ethernet packets are re-timed with respect to the master clock, and then transmitted in the physical layer. Thus, data packets (e.g., on path 931 and 932) are re-timed and transmitted without any time stamp information being recorded in the data packet. The packets may be generated by corresponding applications such as IPTV (Internet Protocol Television), VoIP (Voice over Internet Protocol), etc.

Thus, line card 930 receives a packet on path 931, and forwards the packet on output 946 after the packet has been re-timed (synchronized) with a master clock. Similarly, line card 950 receives a packet on path 951, and forwards the packet on output 966 after the packet has been re-timed (synchronized) with a master clock.

The master clock (911/clock 1) is generated by timing card 910. Timing card 920 generates a redundant clock (921/clock-2) that is to be used by line cards 930 and 950 upon failure of master clock 911. Master clock 911 and redundant clock 921 are provided via a backplane (represented by numeral 970) to each of lines cards 930 and 950.

In line card 930, jitter attenuator PLL 940 may be implemented as PLL 300 described above in detail, and receives clocks 911 and 921. PLL 940 generates an output clock 941 which is used to synchronize (re-time) packets received on path 931 and forwarded as re-timed packets on path 946. Upon being out of phase-lock, PLL 940 is designed to provide locking of phase in the manner described above in detail.

Similarly, in line card 950, jitter attenuator PLL 960 may also be implemented as PLL 300 described above in detail, and receives clocks 911 and 921. PLL 960 generates an output clock 961 which is used to synchronize (re-time) packets received on path 951 and forwarded as re-timed packets on path 966. Upon being out of phase-lock, PLL 960 is designed to provide locking of phase in the manner described above in detail.

Alternatively, each of jitter attenuator PLL 940 and 960 may correspond to a respective output block 785 of FIG. 7, with the rest of the blocks of FIG. 7 being common to all the line cards, and with clocks 911 and 921 instead being provided as inputs to MUX 705 of FIG. 7.

10. Conclusion

References throughout this specification to "one embodiment", "an embodiment", or similar language means that a particular feature, structure, or characteristic described in connection with the embodiment is included in at least one embodiment of the present disclosure. Thus, appearances of the phrases "in one embodiment", "in an embodiment" and similar language throughout this specification may, but do not necessarily, all refer to the same embodiment.

While in the illustrations of FIGS. 1, 3, 4A, 4B and 7, although terminals/nodes are shown with direct connections to (i.e., "connected to") various other terminals, it should be appreciated that additional components (as suited for the specific environment) may also be present in the path, and accordingly the connections may be viewed as being "electrically coupled" to the same connected terminals.

It should be appreciated that the specific type of transistors (such as NMOS, PMOS, etc.) noted above are merely by way of illustration. However, alternative embodiments using different configurations and transistors will be apparent to one skilled in the relevant arts by reading the disclosure provided herein. For example, the NMOS transistors may be replaced with PMOS (P-type MOS) transistors, while also interchanging the connections to power and ground terminals.

Accordingly, in the instant application, the power and ground terminals are referred to as constant reference potentials, the source (emitter) and drain (collector) terminals of transistors (though which a current path is provided when turned on and an open path is provided when turned off) are termed as current terminals, and the gate (base) terminal is termed as a control terminal.

While various embodiments of the present disclosure have been described above, it should be understood that they have been presented by way of example only, and not limitation. Thus, the breadth and scope of the present disclosure should not be limited by any of the above-described embodiments, but should be defined only in accordance with the following claims and their equivalents.

What is claimed is:

1. A phase-locked loop (PLL) comprising:
a phase detector coupled to receive a first input clock on an input path and a feedback clock on a feedback path, said phase detector to generate an error signal representing a phase difference between said first input clock and said feedback clock;
a low-pass filter to generate a filtered error signal by filtering said error signal;
an oscillator coupled to generate an intermediate clock from said filtered error signal, wherein a frequency of said intermediate clock is determined by a magnitude of said filtered error signal;
an output block to generate each of successive cycles of said feedback clock on counting of a pre-determined number of cycles of said intermediate clock; and
a phase locking block to detect said PLL being out of phase-lock, and controlling said output block to lock phase of said PLL within two cycles of said first input clock from said detecting.

2. The PLL of claim 1, wherein said phase locking block locks phase of said PLL while also preventing glitches in said feedback clock during said locking.

3. The PLL of claim 1, wherein said feedback clock is an output clock of said PLL and has a same frequency as a frequency of said first input clock,
wherein said PLL is used as a zero-delay buffer (ZDB) for said first input clock.

4. The PLL of claim 3, wherein a condition of said PLL entering said out of phase-lock occurs due to a phase shift in said first input clock when said PLL is in phase lock,
wherein said phase locking block locks phase of said PLL by:
restarting said output block to start counting said pre-determined number of cycles synchronous with said first input clock to cause said output block to thereafter count said pre-determined number of cycles before generating each next cycle of said successive cycles.

5. The PLL of claim 4, wherein said phase locking block comprises:
a phase threshold-crossing detector to detect said PLL being out of phase-lock, and to generate a control signal with a first value if said PLL is determined to be out of phase-lock, and a second value if said PLL is determined to be in phase-lock, wherein said phase threshold-crossing detector detects said PLL being out of phase-lock if a magnitude of said error signal exceeds an out-of-lock threshold;
a reset-generator block to assert a divider-reset signal if said control signal has said first value; and
a synchronizer block to synchronize said divider-reset signal with said intermediate clock to generate a synchronized divider-reset signal.

6. The PLL of claim 5, where said output block comprises:
a delay block to receive said synchronized divider-reset signal and to forward said synchronized divider-reset signal as a reset signal in an asserted state after a programmed delay configured in said delay block, and to de-assert said reset signal synchronous with said first input clock;
a divider coupled to receive said intermediate clock and said reset signal, said divider to generate each of successive cycles of a divided clock on counting of a pre-determined number of cycles of said intermediate clock so as to cause a frequency of said output clock to equal that of said first input clock; and
a gating block to forward said divided clock as said feedback clock if said PLL is in phase-lock, and to not forward said divided clock as said feedback clock for a portion of a duration in which said PLL is out of phase-lock,
wherein said phase locking block holds said divider in reset for one period of said first input clock.

7. The PLL of claim 6, wherein said reset-generator block comprises:
a first multiplexer (MUX) coupled to receive said first input clock and a backup clock, said first MUX to forward said first input clock as a selected clock if a first select signal has a first value, said first MUX to forward said backup clock as said selected clock if said first select signal has a second value; and
a first flip-flop coupled to receive said selected clock of said first MUX on a clock input, a second reset signal fixed at logic LOW on a data input and said control signal on an asynchronous set input, said first flip-flop to assert said divider-reset signal if said control signal is logic HIGH,
wherein said delay block comprises:
a second MUX coupled to receive said synchronized divider-reset signal and a constant reference potential (GND) as inputs, said second MUX to forward said synchronized divider-reset signal as an output if a second select signal has a first value, said second MUX to forward said constant reference potential as said output if said second select signal has a second value.

8. The PLL of claim 7, wherein said gating block comprises:
an inverter to invert said synchronized divider-reset signal;
a second flip-flop coupled to receive said divided clock at a negative edge-triggered clock input and said inverted synchronized divider-reset signal at a data input, said second flip-flop to generate a flip-flop output signal;
an OR gate coupled to receive said inverted synchronized divider-reset signal and said flip-flop output signal and to generate an OR-output; and
an AND gate coupled to receive said OR-output and said divided clock, said AND gate to propagate said divided clock as said feedback clock if said OR-output is a logic HIGH, and to not propagate said divided clock if said OR-output is a logic LOW,
wherein said second select signal of said second MUX is coupled to said OR-output.

9. The PLL of claim 8, further comprising:
a plurality of output blocks generating a plurality of output clocks, each output block generating each of successive cycles of said feedback clock on counting of a respective pre-determined number of cycles of said output clock,
wherein a phase of said first input clock has a respective pre-determined phase relationship with said phase of each of said output clock of said plurality of output clocks;

wherein said phase locking block restores each of said pre-determined phase relationships upon said PLL being out of phase-lock, wherein a first output clock of said plurality of output clocks has zero phase difference with respect to said phase of said first input clock, a same frequency as a frequency of said first input clock, and wherein said first output clock is used as said feedback clock.

10. The PLL of claim 9, wherein said delay block and said divider in each output block of said plurality of output blocks is programmed with a corresponding delay and a divide code respectively to enable said pre-determined phase relationship and frequency for each of said plurality of output clocks.

11. The PLL of claim 5, wherein said phase threshold-crossing detector generates said control signal with said first value only if:

a second pre-determined number of consecutive error signals exceed said out-of-lock threshold; and each of said second pre-determined number of consecutive error signals is within a pre-determined percentage value with respect to the rest of the error signals in said second pre-determined number of consecutive error signals.

12. The PLL of claim 5, wherein said first input clock ceases to be present following said phase shift, wherein said low-pass filter is additionally designed to generate a rising edge of said backup clock at the end of a time interval equaling two periods of said first input clock from the time instant at which said control signal changes to said first value, wherein said rising edge restarts said output block to start counting said pre-determined number of cycles concurrent with said rising edge of said backup clock.

13. The PLL of claim 2, wherein said intermediate clock is an output clock of said PLL, and said divided clock is said feedback clock, wherein a frequency divider is in said feedback path of said PLL and generates said divided clock, wherein said output clock has a frequency that is a multiple of said first input clock.

14. A system comprising:

a line card coupled to receive a data packet, said line card to re-time said data packet with reference to a selected clock, and to transmit a re-timed packet;

a first timing card to generate a first clock; and wherein said line card comprises a phase-locked loop (PLL) coupled to receive said first clock, said PLL to provide an output clock based on said first clock as said selected clock, wherein said PLL comprises:

a phase detector coupled to receive said first clock and a feedback clock, said phase detector to generate an error signal representing a phase difference between said first clock and said feedback clock;

a low-pass filter to generate a filtered error signal by filtering said error signal;

an oscillator coupled to generate an intermediate clock from said filtered error signal, wherein a frequency of said intermediate clock is determined by a magnitude of said filtered error signal;

an output block comprising:

a divider coupled to receive said intermediate clock and to generate each of successive cycles of a divided clock on counting of a pre-determined number of cycles of said intermediate clock; and a gating block to forward said divided clock as said feedback clock if said PLL is in phase-lock, and to not forward said divided clock as said feedback clock for a portion of a duration in which said PLL is out of phase-lock; and a phase locking block comprising:

a phase threshold-crossing detector to detect, based on said error signal, said PLL going out of phase-lock from a steady-state; and a reset-generator block to, following detection of said PLL going out of phase-lock, restart said divider to start counting said pre-determined number of cycles synchronous with said first clock to cause said divider to thereafter count said pre-determined number of cycles before generating each next cycle of said successive cycles, wherein said feedback clock is said output clock of said PLL.

15. The system of claim 14, wherein said feedback clock has a same frequency as a frequency of said first clock, wherein said PLL is used as a zero-delay buffer (ZDB) for said first clock, wherein said pre-determined number is such that it causes a frequency of said output clock to be equal to that of said first clock.

16. The system of claim 15, wherein a condition of said PLL entering said out of phase-lock occurs due to a phase shift in said first input clock when said PLL is in phase lock, wherein said phase threshold-crossing generates a control signal with a first value if said PLL is determined to be out of phase-lock, and a second value if said PLL is determined to be in phase-lock, wherein said phase threshold-crossing detector detects said PLL being out of phase-lock if a magnitude of said error signal exceeds an out-of-lock threshold, wherein said reset-generator block asserts a divider-reset signal if said control signal has said first value, said divider-reset signal designed to cause said divider to be placed in a reset condition, wherein said phase locking block further comprises:

a synchronizer block to synchronize said divider-reset signal with said intermediate clock to generate a synchronized divider-reset signal.

17. The system of claim 16, wherein said reset-generator block comprises:

a first multiplexer (MUX) coupled to receive said first clock and a backup clock, said first MUX to forward said first clock as a MUX-selected clock if a first select signal has a first value, said first MUX to forward said backup clock as said MUX-selected clock if said first select signal has a second value; and a first flip-flop coupled to receive said MUX-selected clock of said first MUX on a clock input, a second reset signal fixed at logic LOW on a data input and said control signal on an asynchronous set input, said first flip-flop to assert said divider-reset signal if said control signal is logic HIGH, wherein said delay block comprises:

a second MUX coupled to receive said synchronized divider-reset signal and a constant reference potential (GND) as inputs, said second MUX to forward said synchronized divider-reset signal as an output if a second select signal has a first value, said second MUX to forward said constant reference potential as said output if said second select signal has a second value.

18. The system of claim 17, where said output block further comprises:

a delay block to receive said synchronized divider-reset signal and to forward said synchronized divider-reset signal as a reset signal in an asserted state after a programmed delay configured in said delay block, and to de-assert said reset signal synchronous with said first clock, wherein said phase locking block holds said divider in reset for one period of said first clock.

19. The system of claim 18, wherein said gating block comprises:

an inverter to invert said synchronized divider-reset signal;

a second flip-flop coupled to receive said divided clock at a negative edge-triggered clock input and said inverted synchronized divider-reset signal at a data input, said second flip-flop to generate a flip-flop output signal;

an OR gate coupled to receive said inverted synchronized divider-reset signal and said flip-flop output signal and to generate an OR-output; and an AND gate coupled to receive said OR-output and said divided clock, said AND gate to propagate said divided clock as said feedback clock if said OR-output is a logic HIGH, and to not propagate said divided clock if said OR-output is a logic LOW, wherein said second select signal of said second MUX is coupled to said OR-output.

20. The system of claim 17, wherein said first clock ceases to be present following said phase shift, wherein said low-pass filter is additionally designed to generate a rising edge of said backup clock at the end of a time interval equaling two periods of said first input clock from the time instant at which said control signal changes to said first value, wherein said rising edge restarts said output block to start counting said pre-determined number of cycles concurrent with said rising edge of said backup clock.

* * * * *